(12) United States Patent
Ku et al.

(10) Patent No.: US 6,743,690 B2
(45) Date of Patent: Jun. 1, 2004

(54) METHOD OF FORMING A METAL-OXIDE SEMICONDUCTOR TRANSISTOR

(75) Inventors: Tzu-Kun Ku, Taipei (TW); Wen-Chu Huang, Changhua Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/237,605

(22) Filed: Sep. 10, 2002

(65) Prior Publication Data

US 2004/0048438 A1 Mar. 11, 2004

(51) Int. Cl.[7] .............................................. H01L 21/336
(52) U.S. Cl. ........................................................ 438/306
(58) Field of Search ................................. 438/299, 301, 438/305, 306

(56) References Cited

U.S. PATENT DOCUMENTS 5,747,373 A  *  5/1998  Yu ............................. 438/305
5,981,325 A       11/1999  Hung
6,187,644 B1       2/2001  Lin et al.
6,498,067 B1  *  12/2002  Perng et al. ................ 438/305

* cited by examiner

Primary Examiner—Kamand Cuneo
Assistant Examiner—Scott B. Geyer
(74) Attorney, Agent, or Firm—Birch, Stewart, Kolasch & Birch, LLP

(57) ABSTRACT

A method of forming a metal-oxide semiconductor (MOS) transistor. A semiconductor substrate is provided. A polysilicon layer is then deposited on the semiconductor substrate. The polysilicon layer is selectively etched to form a gate electrode. A silicon oxide layer is grown on the top and the sidewall. Ions (or dopants) are doped into the semiconductor substrate to form a lightly doped region. Then, a nitride spacer is formed on the sidewall of the silicon oxide layer. Finally, ions are doped into the semiconductor substrate to form a heavily doped region to serve as a source/drain of the MOS transistor.

10 Claims, 6 Drawing Sheets

METHOD OF FORMING A METAL-OXIDE SEMICONDUCTOR TRANSISTOR

BACKGROUND OF THE INVENTION

1. Field of the Invention

The present invention relates to the manufacture of semiconductor devices, more particularly, to a method of forming a metal-oxide semiconductor (MOS) transistor.

2. Description of the Related Art

In the manufacture of MOS transistors, offset spacers have been used to reduce the distance (known as "overlap") between the gate and the shallow source/drain extension (SDE) extending under the gate. Also, SDE-to-gate overlap and vertical junction depth can be independently varied by varying the thickness of the offset spacer.

FIG. 1A to FIG. 1H are cross-sections showing the manufacturing steps of a metal-oxide semiconductor (MOS) transistor having a offset spacer according to the prior art.

As shown in FIG. 1A, a semiconductor substrate 10 is provided having shallow trench isolation STI therein to define the active region. A gate oxide 12 is grown on the semiconductor substrate 10 in thermal ambient containing oxygen. Next, a doped polysilicon layer 14 is formed on the gate oxide 12 by low-pressure chemical vapor deposition (LPCVD).

Then, as shown in FIG. 1B, a photoresist pattern (for clarity, not shown) is formed on the polysilicon layer 14 at the predetermined position by photolithography. The polysilicon layer 14 and the gate oxide 12 are anisotropically etched to leave a polysilicon structure 14a, serving as the gate electrode, and a gate oxide 12a while the photoresist pattern is used as the etching mask. In this etching step, mechanical stresses are generated in the polysilicon structure 14a caused by ion bombardment.

The semiconductor substrate 10 is cleaned in an ultrasonic tank to remove undesirable particles and residues.

To eliminate mechanical stresses, the polysilicon structure 14a is annealed at an elevated temperature so that an oxide thin film 16 having a thickness of less than 50 angstroms is formed as shown in FIG. 1C. In this step, the polysilicon structure can be rounded.

As shown in FIG. 1D, an insulating layer 18, having a thickness of about 150 angstroms, such as silicon oxide or silicon nitride is deposited by low-pressure chemical vapor deposition at an elevated temperature.

As shown in FIG. 1E, the insulating layer 18 and the oxide thin film 16 are etched back to form an offset spacer OS consisting of an oxide spacer 16a and an insulator spacer 18a. Next, as shown in FIG. 1F, ions such as phosphorus or arsenic are implanted into the semiconductor substrate 10 to create lightly doped regions 22, 24.

Referring to FIG. 1G, a silicon nitride layer 26, having a thickness of about 2500 angstroms, is deposited on the semiconductor substrate 10 and the gate electrode 14a. Next, as shown in FIG. 1H, the silicon nitride layer 26 is etched back to form a silicon nitride spacer 26a on the sidewall of the offset spacer OS.

Then, as shown in FIG. 1H, ions such as phosphorus or arsenic are implanted into the semiconductor substrate 10 to create heavily doped regions 28, 30 serving as the source/drain region.

However, as the length of the polysilicon structure 14a for gate continues to shrink, the critical dimension (CD) of the polysilicon structure is not easily controlled by photolithography.

Furthermore, the polysilicon structure tends to peel from the semiconductor substrate 10 during ultrasonic cleaning.

Also, the offset spacer OS is manufactured by thermal oxidation of the oxide thin film 16 and deposition of the insulating layer 18 followed by etching of the oxide thin film 16 and the insulating layer 18. Therefore, process complexity and manufacturing cost such as thermal budget is increased.

U.S. Pat. No. 5,981,325 to Hung discloses a method for manufacturing CMOS. A first offset spacer and a second offset spacer, double offset spacers, are sequentially formed on the sidewall of the gate electrode of CMOS by low-pressure chemical vapor deposition.

U.S. Pat. No. 6,187,644 to Lin et al. discloses a method of removing oxynitride by forming an offset spacer. A dielectric layer such as silicon oxide is deposited on the gate region. Then, the dielectric layer is subjected to etching back to form an offset spacer. Also, the dielectric layer has a thickness of about 100 to 600 angstroms.

However, the problems related to high manufacturing cost or peeling caused by deposition cannot be completely eliminated.

Therefore, a need has risen for providing an improved method of forming a metal-oxide semiconductor transistor.

SUMMARY OF THE INVENTION

In view of the above disadvantages, an object of the invention is to provide a method of forming a metal-oxide semiconductor (MOS) transistor in which the polysilicon structure is easily controlled by photolithography.

A further object of the invention is to provide a method of forming a metal-oxide semiconductor (MOS) transistor whose process complexity and manufacturing cost such as thermal budget can be reduced.

A further object of the invention is to provide a method of forming a method of forming a metal-oxide semiconductor transistor in which the adhesion between the polysilicon structure and the semiconductor substrate can be enhanced.

In accordance with one aspect of the invention, there is provided a method of forming a metal-oxide semiconductor (MOS) transistor. A semiconductor substrate is provided. A polysilicon layer is then deposited on the semiconductor substrate. The polysilicon layer is selectively etched to form a gate electrode. A silicon oxide layer is grown on the top and the sidewall. Ions (or dopants) are doped into the semiconductor substrate to form a lightly doped region. Then, a nitride spacer is formed on the sidewall of the silicon oxide layer. Finally, ions are doped into the semiconductor substrate to form a heavily doped region to serve as a source/drain of the MOS transistor.

In accordance with another aspect of the invention, the oxide layer is preferably etched back to form an oxide spacer serving as the offset spacer.

In accordance with a further aspect of the invention, the silicon oxide layer preferably has a thickness of about 60 to 180 angstroms. More preferably, the silicon oxide layer has a thickness of about 60 to 250 angstroms. Also, the oxide layer is preferably grown at a temperature of about 700° C. to 1200° C., more preferably, it is grown at a temperature of about 850° C. to 900° C. in an ambient containing oxygen for 3 to 4 hours.

In accordance with yet another aspect of the invention, the semiconductor substrate is cleaned in an ultrasonic tank after the polysilicon layer is etched to form a gate electrode.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The preferred embodiment of the invention is hereinafter described with reference to the accompanying drawings, which are given by way of illustration only, and thus are not limitative of the present invention, and in which.

DETAILED DESCRIPTION OF THE INVENTION

FIG. 2A to FIG. 2H are cross-sections showing the manufacturing steps of forming a metal-oxide semiconductor (MOS) transistor according to the embodiment of the invention.

Figure 1A:
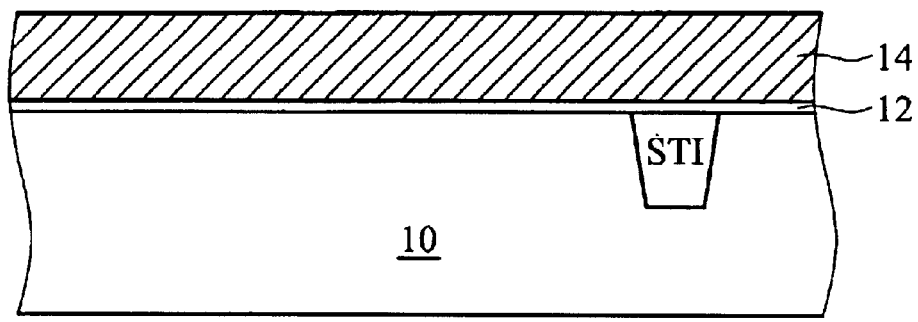
FIG. 1A to FIG. 1H are cross-sections showing the manufacturing steps of forming a metal-oxide semiconductor (MOS) transistor according to the prior art.
Figure 1B:
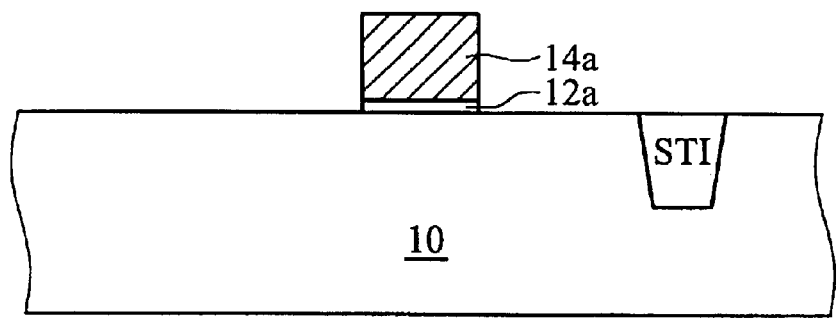
Figure 1C:
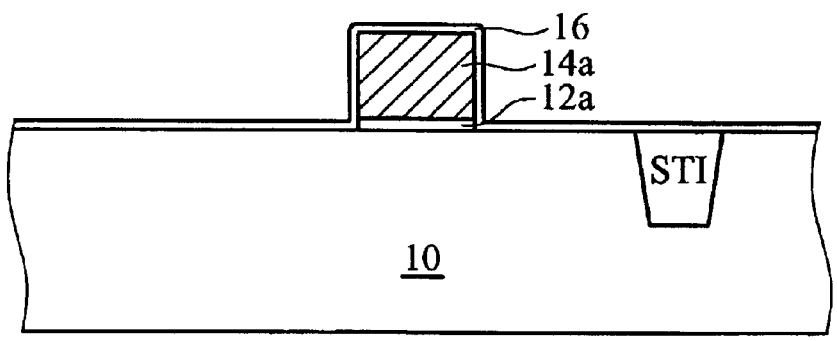
Figure 1D:
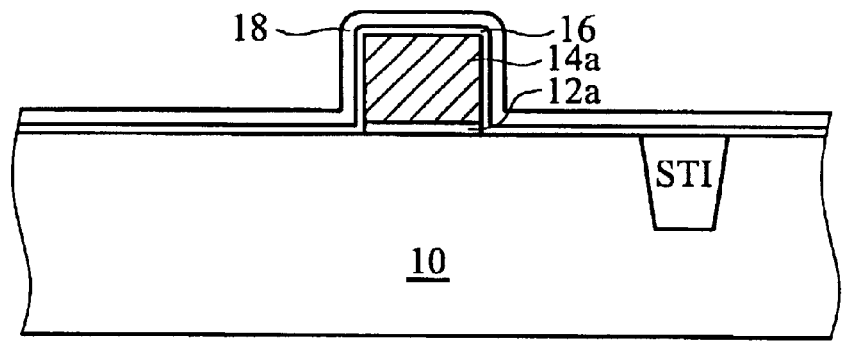
Figure 1E:
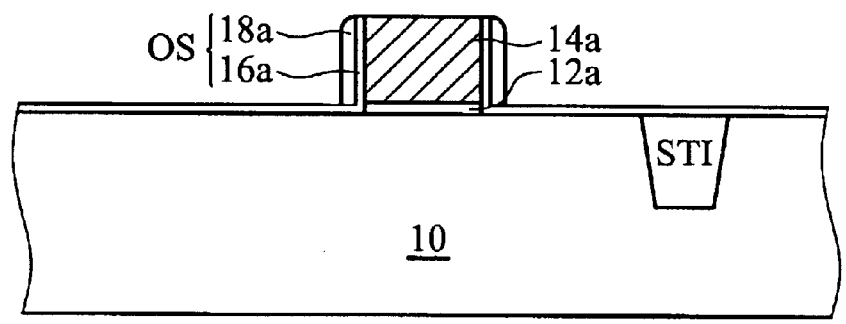
Figure 1F:
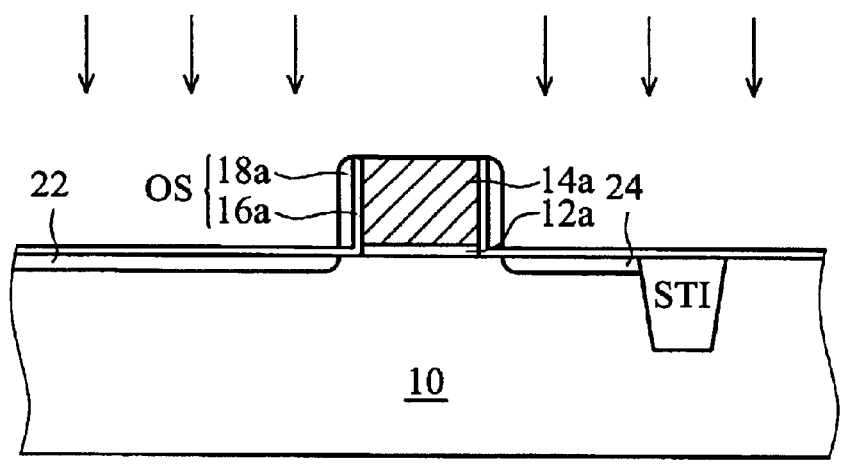
Figure 1G:
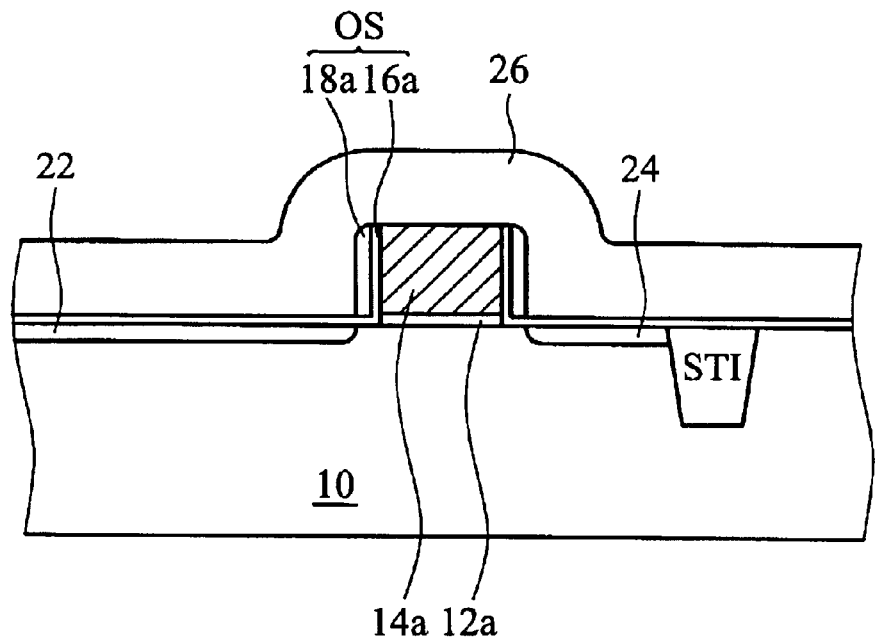
Figure 1H:
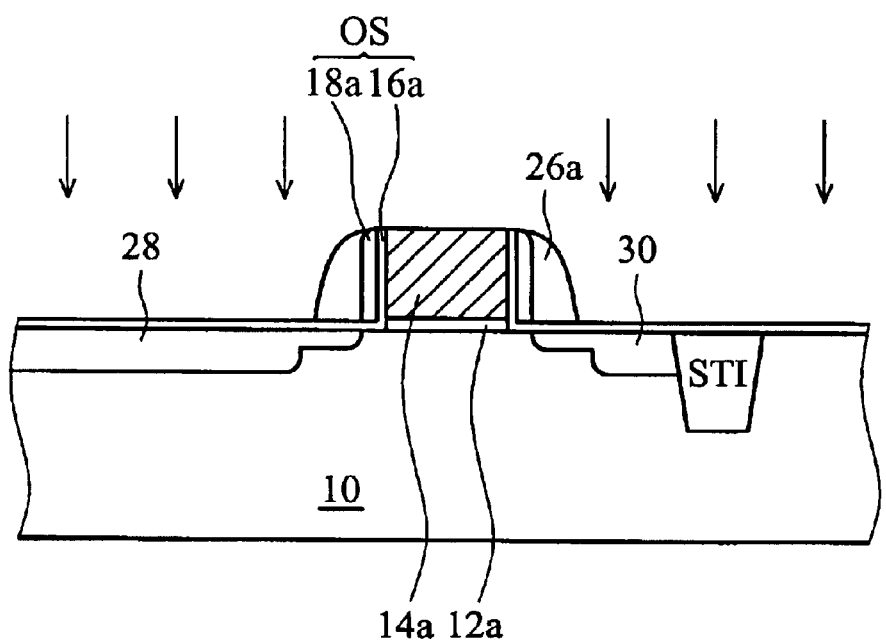
Figure 2A:
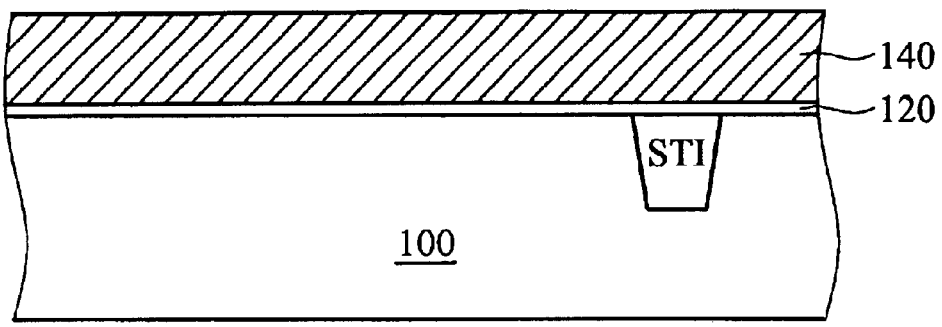
FIG. 2A to FIG. 2H are cross-sections showing the manufacturing steps of forming a metal-oxide semiconductor (MOS) transistor according to the embodiment of the invention.

As shown in FIG. 2A, a semiconductor substrate 100 of single-crystalline silicon is provided. The semiconductor substrate 100 has shallow trench isolation STI to define the active region. A gate oxide 120, having a thickness of about 80 to 200 angstroms, is grown on the semiconductor substrate 100 in an ambient containing oxygen or water at an elevated temperature. Next, a doped polysilicon layer 140, having a thickness of about 2500 angstroms, is formed on the gate oxide 120 by low-pressure chemical vapor deposition (LPCVD) using silicon containing gas such as $SiH_4$ or $SiH_2Cl_2$ at a temperature of about 550° C. to 650° C.

Figure 2B:
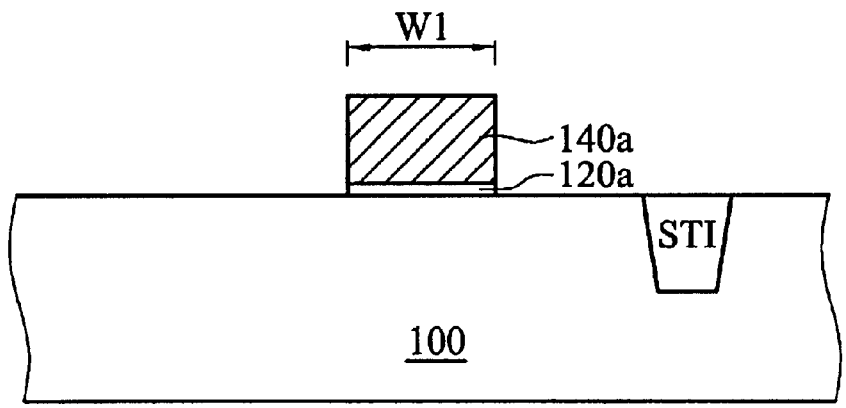

Then, as shown in FIG. 2B, a photoresist pattern (for clarity, not shown) is formed on the polysilicon layer 140 by photolithography, at the predetermined position. In 0.13 $\mu$m process, the photoresist pattern has a width of about 0.115 $\mu$m. Next, the polysilicon layer 140 and the gate oxide 120 are anisotropically etched to leave a polysilicon structure 140a, serving as the gate electrode, and a gate oxide 120a while the photoresist pattern is used as the etching mask. The pattern of the polysilicon structure 140a is transferred by the photoresist pattern so that the polysilicon structure 140a has a width W1 of about 0.115 $\mu$m. Furthermore, in this etching step, mechanical stresses are generated in the polysilicon structure 140a by ion bombardment.

Figure 2C:
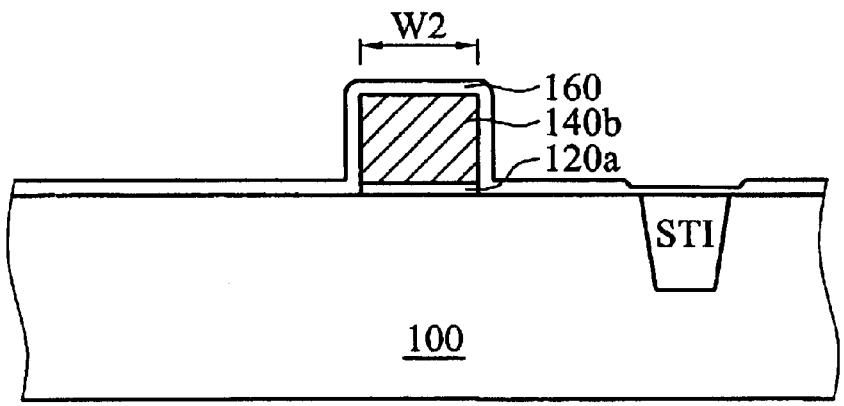

Turning now to FIG. 2C, the semiconductor substrate 100 is placed in a thermal oxidation furnace. An oxygen-containing gas is then introduced into the thermal oxidation furnace, thus forming a silicon oxide layer 160 on the semiconductor substrate 100 and the sidewall and the top of the gate electrode 140a. By this thermal oxidation, the polysilicon structure 140a is slightly consumed to leave a polysilicon structure 140b having a width W2 of about 0.09 $\mu$m thus reducing the effective channel length of MOS transistor. The silicon oxide layer 160 has a thickness of about 60 to 250 angstroms and is grown at a temperature of about 800° C. to 1000° C. for 3 to 4 hours. In this step, the gate electrode 140a consisting of polysilicon is slightly consumed. Also, defects in the gate electrode 140a are in-situ annealed and eliminated in the thermal oxidation. Alternately, rapid thermal oxidation for 3 to 5 minutes at a temperature of about 1000° C. replaces the thermal oxidation furnace.

Figure 2D:
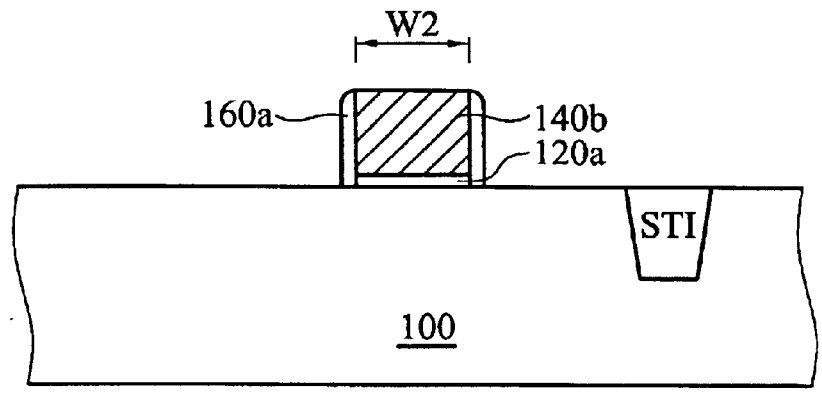
Figure 2E:
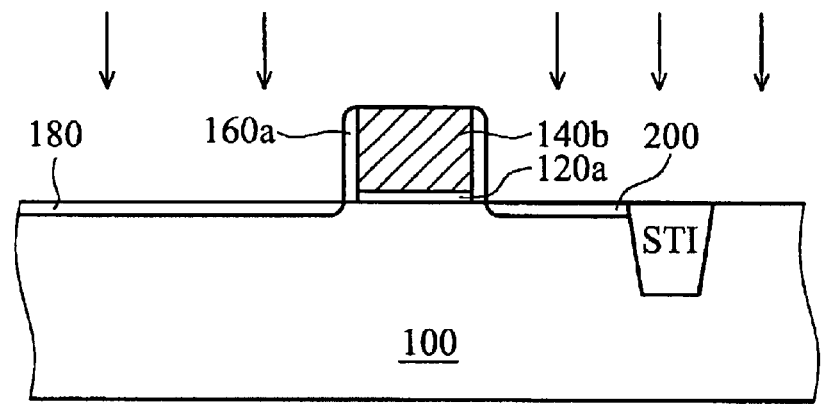

As shown in FIG. 2D, the silicon oxide layer 160 is etched back to form an offset spacer 160a consisting of silicon oxide. Next, as shown in FIG. 2E, ions such as phosphorus or arsenic are implanted into the semiconductor substrate 100 to create lightly doped regions 180, 200.

Figure 2F:
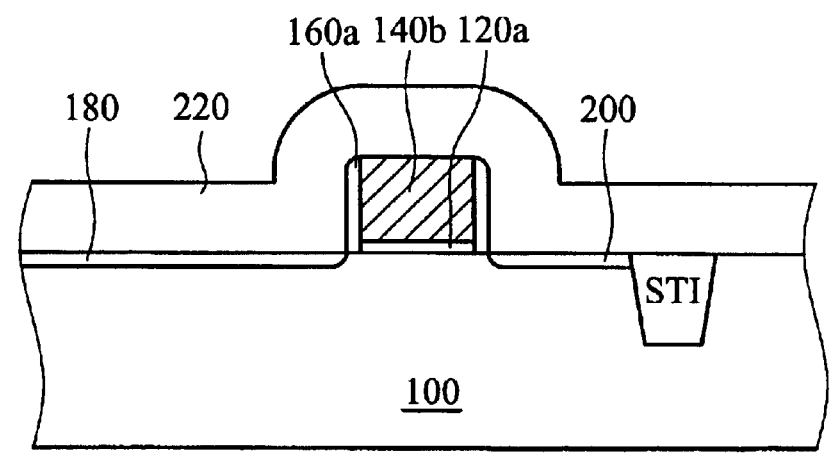
Figure 2G:
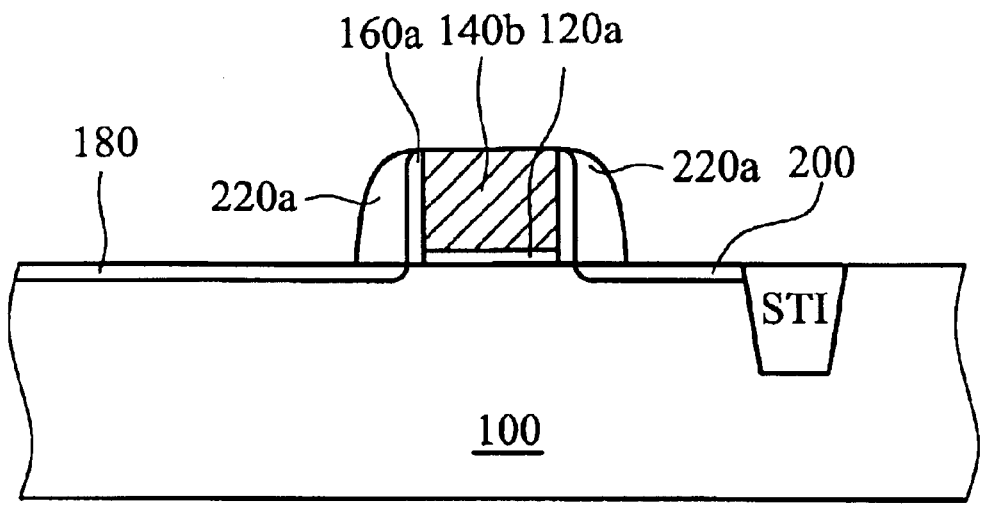

Referring to FIG. 2F, a silicon nitride layer 220, having a thickness of about 2500 angstroms, is deposited on the semiconductor substrate 100 and the gate electrode 140b by low-pressure chemical vapor deposition using the $SiCl_2H_2$ and $NH_3$. Next, as shown in FIG. 2G, the silicon nitride layer 220 is etched back to form a silicon nitride spacer 220a on the sidewall of the offset spacer 160a.

Figure 2H:
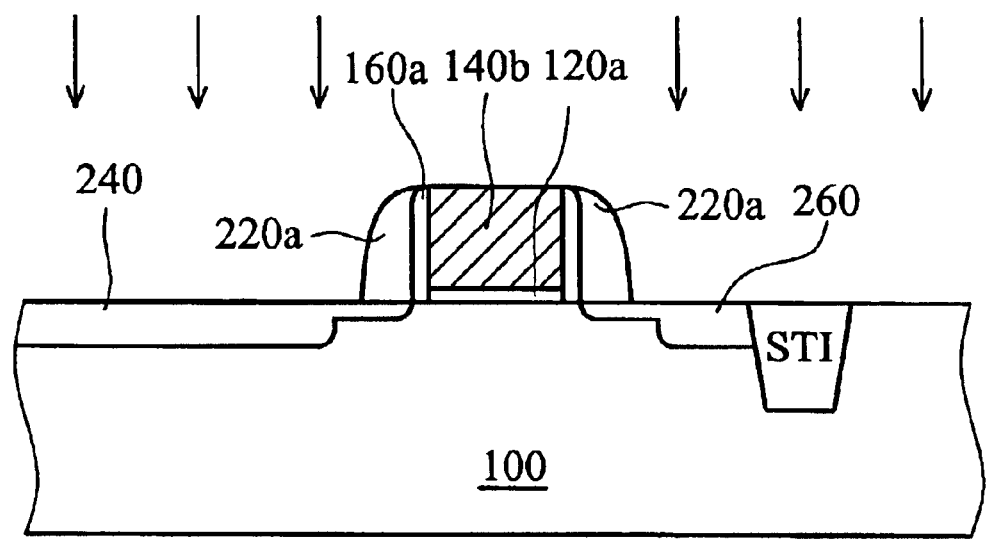

Then, as shown in FIG. 2H, ions such as phosphorus or arsenic, having heavier dosage and energy, are implanted into the semiconductor substrate 100 to create heavily doped regions 240, 260 serving as the source/drain region.

According to the method of forming a metal-oxide semiconductor (MOS) transistor of the invention, the polysilicon structure is easily controlled by photolithography because the polysilicon structure serving as the gate electrode is consumed during the thermal oxidation. Unlike the conventional method, the polysilicon layer having a larger width can be defined.

Furthermore, according to the method of the invention, process complexity and manufacturing cost such as thermal budget can be reduced, because mechanical stress can be eliminated or reduced during formation of the silicon oxide layer, having a predetermined thickness, for offset spacer.

Furthermore, according to the method of forming a method of forming a metal-oxide semiconductor transistor, the adhesion between the polysilicon structure and the semiconductor substrate can be enhanced because the polysilicon structure has a relatively larger width.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method of forming a metal-oxide semiconductor (MOS) transistor, comprising the steps in sequence of:

providing a semiconductor substrate;

depositing a polysilicon layer on the semiconductor substrate;

selectively etching the polysilicon layer to form a gate electrode;

growing a silicon oxide layer for 3 to 4 hours on the top and the sidewall of the gate electrode by thermal oxidation;

doping ions into the semiconductor substrate to form a lightly doped region;

forming a nitride spacer on the sidewall of the silicon oxide layer; and doping ions into the semiconductor substrate to form a heavily doped region to serve as a source/drain of the MOS transistor.

2. A method of forming a metal-oxide semiconductor (MOS) transistor as claimed in claim 1, wherein the silicon oxide layer has a thickness of about 60 to 250 angstroms.

3. A method of forming a metal-oxide semiconductor (MOS) transistor as claimed in claim 2, wherein the silicon oxide has a thickness of about 60 to 120 angstroms.

4. A method of forming a metal-oxide semiconductor (MOS) transistor as claimed in claim 1, further comprising the step of etching back the oxide layer to form an oxide spacer serving as the offset spacer.

5. A method of forming a metal-oxide semiconductor (MOS) transistor as claimed in claim 1, wherein the oxide layer is grown at a temperature of about 700° C. to 1200° C.

6. A method of forming a metal-oxide semiconductor (MOS) transistor as claimed in claim 5, wherein the oxide layer is grown at a temperature of about 850° C. to 900° C.

7. A method of forming a metal-oxide semiconductor (MOS) transistor as claimed in claim 1, wherein the gate electrode is in-situ annealed by the thermal oxidation step.

8. A method of forming a metal-oxide semiconductor (MOS) transistor as claimed in claim 1, wherein the oxide layer is grown in an ambient containing oxygen.

9. A method of forming a metal-oxide semiconductor (MOS) transistor, comprising the steps in sequence of:

providing a semiconductor substrate;

depositing a polysilicon layer on the semiconductor substrate;

selectively etching the polysilicon layer to form a gate electrode;

cleaning the semiconductor substrate in an ultrasonic tank;

forming a silicon oxide layer, having a thickness of about 60 to 120 angstroms, on the top and the sidewall of the gate electrode by reaction of silicon in the gate electrode with oxygen;

doping ions into the semiconductor substrate to form a lightly doped region;

forming a nitride spacer on the sidewall of the silicon oxide layer; and doping ions into the semiconductor substrate to form a heavily doped region to serve as a source/drain of the MOS transistor.

10. A method of forming a metal-oxide semiconductor (MOS) transistor as claimed in claim 9, wherein the oxide layer is grown at a temperature of about 700° C. to 1200° C. for 3 to 4 hours in an ambient containing oxygen.

* * * * *